United States Patent [19]

Ipri et al.

[11] Patent Number: 4,926,236
[45] Date of Patent: May 15, 1990

[54] MULTILAYER INTERCONNECT AND METHOD OF FORMING SAME

[75] Inventors: Alfred C. Ipri, Hopewell Township, Mercer County; Roger G. Stewart, Hillsboro Township, Hunterdon County, both of N.J.

[73] Assignee: General Electric Company, Schenectady, N.Y.

[21] Appl. No.: 828,687

[22] Filed: Feb. 12, 1986

[51] Int. Cl.$^5$ .................. H01L 23/48; H01L 29/04
[52] U.S. Cl. ........................... 357/71; 357/59; 357/68
[58] Field of Search ............. 357/71, 71 P, 68, 59 G, 357/59 I, 59 K

[56] References Cited

U.S. PATENT DOCUMENTS

| | | | |
|---|---|---|---|
| 4,136,434 | 1/1979 | Thibault et al. | 357/59 K |
| 4,326,331 | 4/1982 | Guterman | 29/571 |
| 4,513,397 | 4/1985 | Ipri et al. | 365/185 |
| 4,536,951 | 8/1985 | Rhodes et al. | 357/71 |
| 4,582,563 | 4/1986 | Hazuki et al. | 357/71 R |

FOREIGN PATENT DOCUMENTS

| | | | |
|---|---|---|---|
| 3400295 | 7/1984 | Fed. Rep. of Germany | 357/49 |
| 58-52854 | 3/1983 | Japan | 357/71 |
| 58-92257 | 6/1983 | Japan | 357/71 |
| 59-228737 | 12/1984 | Japan | 357/68 |

OTHER PUBLICATIONS

Arzubi et al, "Metal-oxide Semiconductor Capacitor", IBM Technical Disclosure Bulletin, vol. 17, No. 6, Nov. 1984.

K. Heuber et al, "Self-Aligned Multiline Via Hole", IBM Technical Disclosure Bulletin, vol. 20, No. 9, Feb. 1978.

*Primary Examiner*—Andrew J. James
*Assistant Examiner*—Ngan Van Ngo
*Attorney, Agent, or Firm*—Henry I. Steckler; James C. Davis, Jr.; Paul R. Webb, II

[57] ABSTRACT

A multilayer interconnect and method of forming the same between first and second overlying conductive strips separated by an insulating layer having an aperture therethrough. The improvement wherein at least one edge of the first strip is aligned with an overlying edge of the second strip. The interconnect is formed by depositing the second strip on the insulating layer such that it at least partially overlaps the aperture and extends beyond an edge of the first strip. The second strip and first strip are then partially removed such that at least one edge of the first and second conductive strips are aligned.

9 Claims, 2 Drawing Sheets

MULTILAYER INTERCONNECT AND METHOD OF FORMING SAME

The invention relates to an electrical interconnect between conducting strips in a semiconductor device and a method of making this interconnect by means of an aligned removal process.

BACKGROUND OF THE INVENTION

In the formation of a semiconductor device it is often necessary to interconnect two or more levels of conductive strips, such as polysilicon, which are separated by an insulating layer. For example, a semiconductor device may comprise a semiconductor substrate having a barrier layer formed thereon, a first conductive strip overlying the barrier layer, an insulating layer overlying the first strip and a second conductive strip overlying the insulating layer. A common method of electrically connecting the first and second strips involves forming the first strip on the surface of the barrier layer and forming the insulating layer on the first strip. An aperture is then formed, by standard photolithographic and etching processes, through the insulating layer thus exposing the surface of the first strip. The photolithographic process which defines the aperture must adhere to an alignment tolerance $\lambda$, $\lambda$ being a distance which ensures that the aperture will be bordered on all sides by the first strip. The second strip is then formed, adhering to the alignment tolerance, such that the aperture is bordered on all sides by the second strip. The adherence to the alignment tolerance within the present method requires that the first and second strips border the aperture region on each side, nominally by $\lambda$, thus occupying substantial area and resulting in low device density.

SUMMARY OF THE INVENTION

The invention is an improved multilayer interconnect between first and second conductive strips separated by an insulating layer having an aperture extending therethrough. The improvement comprises at least one edge of the first strip being aligned with an overlying edge of the second strip.

The invention also includes a method of forming the interconnect which comprises the steps of depositing the second strip such that it at least partially overlaps the aperture and extends beyond at least one: edge of the first strip, and removing a portion of the second and first strips such that at least one edge of the first strip is aligned with an overlying edge of the second strip.

DETAILED DESCRIPTION OF THE PREFERRED EMBODIMENTS

Figure 1A:
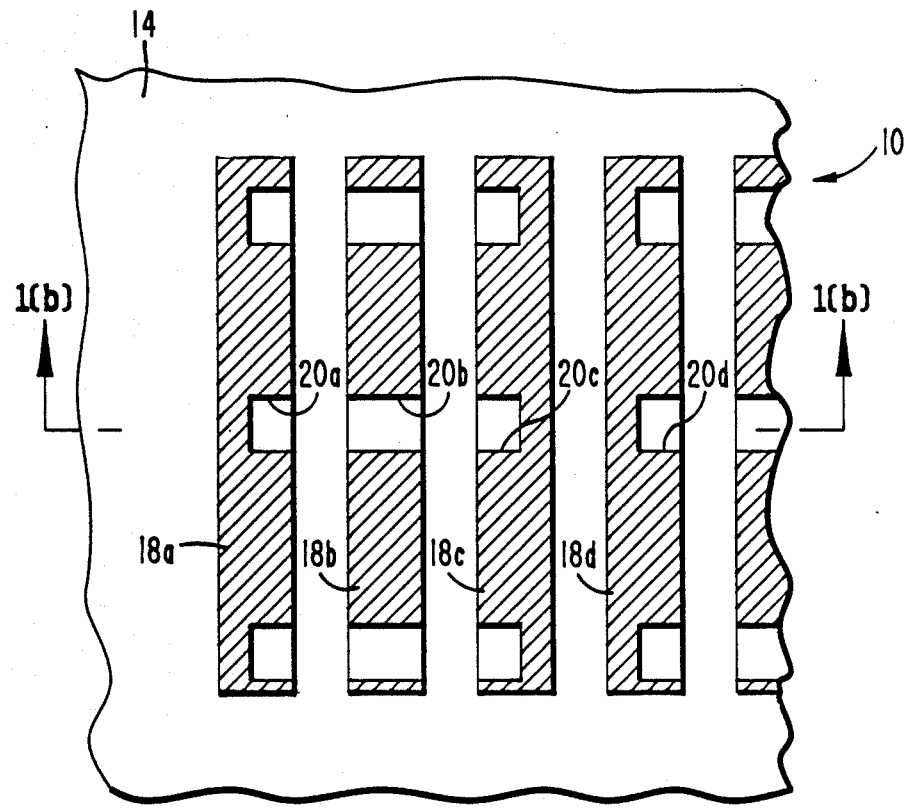
FIG. 1(a) is a top view of a semiconductor device incorporating the invention having a top level of conductive strips removed.
Figure 1B:
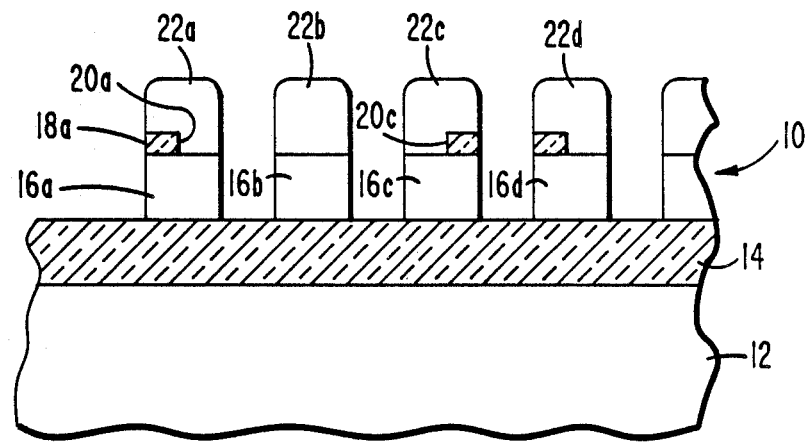
FIG. 1(b) is a cross-sectional view of the device of FIG. 1(a) along the line A—A, having the top level of conductive strips thereon.

In FIGS. 1(a) and 1(b) a semiconductor device 10 comprises a substrate 12 having a barrier layer 14 thereon, and a plurality of first conductive strips 16a–16d overlying the barrier layer 14. Insulating layers 18a–18d having apertures 20a–20d extending therethrough overlie the first strips 16a–16d. A plurality of second conductive strips 22a–22d overlie the first strips 16a–16d and insulating layers 18a–18d such that the first and second strips 16a–16d and 22a–22d, respectively, electrically contact one another within the respective apertures 20a–20d. At least one edge of each of the second strips 22a–22d is aligned with an edge of each of the underlying first strips 16a–16d.

The substrate 12 is composed of a wafer of a semiconductor material such as silicon. The barrier layer 14 is typically composed of silicon dioxide ($SiO_2$) formed over the entire substrate 12 by thermal oxidation or chemical vapor deposition (CVD) techniques. The first and second strips 16a and 22a, respectively, are formed of a conductive material such as aluminum, copper, gold, or, preferably, polycrystalline silicon (p-Si) deposited by CVD or evaporation techniques to a thickness of typically about 500 nanometers (nm). The insulating layer 18a is formed of a suitable dielectric, such as $SiO_2$, by thermal oxidation or CVD to a sufficient thickness, typically about 100 nm, to form an electrically insulating barrier.

Figure 2A:
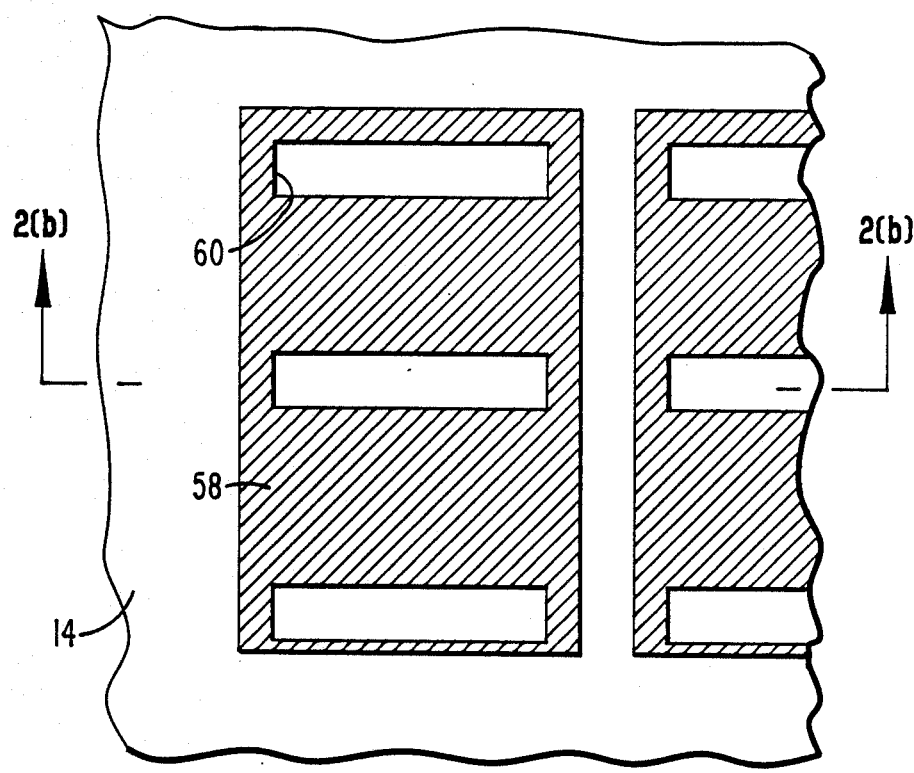
FIG. 2(a) is a top view of a step in the process of forming the multilayer interconnect of the invention, having the top layer removed.
Figure 2B:
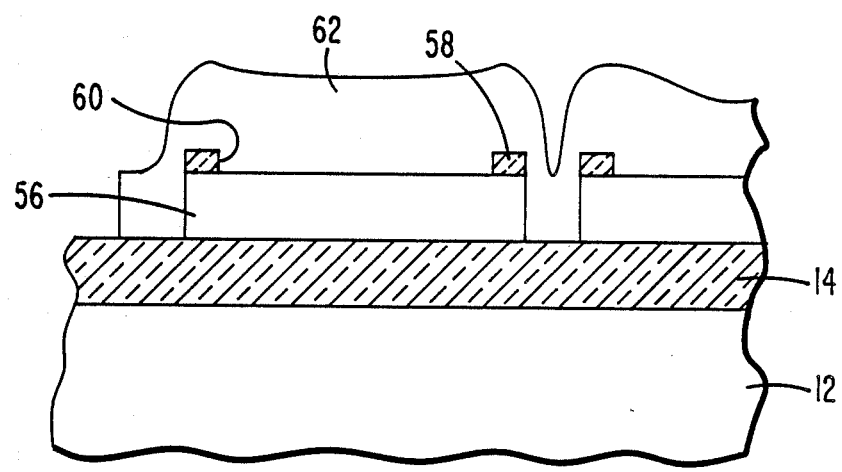
FIG. 2(b) is a cross-sectional view of the resultant structure of FIG. 2(a) along the lines B—B, having the top layer thereon.

The multilayer interconnect of the semiconductor device 10 is fabricated by first forming the barrier layer 14, and forming a first conductive layer 56 as initially defined on the barrier layer 14 as depicted in FIGS. 2(a) and 2(b). An insulating layer 58 is deposited on the first layer 56 and an aperture 60 is formed therein by standard photolithographic and etching techniques. The aperture 60 should overlie the first layer 56 and is typically bordered by the insulating layer 58. Alternatively, the first level of conductive strips may be formed and the insulating layers formed thereon having the apertures therein, such that the insulating layer may not border the aperture on all sides. An etchant such as $CF_4$ plasma or buffered hydrogen fluoride solution typically is used with a $SiO_2$ insulating layer 58. A second conductive layer 62 is deposited over the insulating layer 58 such that the second layer 62 at least partially overlaps the aperture 60 to form an electrical connection with the first layer 56 and also extends beyond at least one edge of the first layer 56. Typically, the second layer 62 will completely overlap the aperture 60 and extend beyond all edges of the first layer strip 56. Portions of the second layer 62, insulating layer 58 and first layer 56 are then removed such that the first and second layers 56 and 62 respectively, forms the plurality of first and second conductive strips 16a–16d and 22a–22d, respectively, and at least one edge of the first strip 16a is aligned with an overlying edge of the second strip 22a as shown in FIGS. 1(a) and 1(b). Alternatively, the plurality of first strips 16a–16d may be formed prior to the aligned removal process. The aligned edges of the first and second strips 16a and 22a, respectively, may contact one another within the region defined by the aperture 20a. Alternatively, the aligned edges may be spaced apart by the insulating layer 18a such that at least one edge of the first strip 16a insulating layer 18a and second strip 22a are aligned. Thus, in contrast with the prior art, it is not critical to adhere to the alignment tolerance since the aperture as finally defined may have minimal or no border. For example, since each interconnect is 2λ in width and is nominally bordered by the required alignment tolerance λ on each side, to form two interconnects the prior art requires two parallel strips of a width of four times the alignment tolerance (4λ) with the strips spaced apart by 2λ. Applicant's process only requires conductive strips of 2λ in width, with the strips spaced apart by 2λ, as no required alignment tolerance, as finally defined, is required.

In the aligned removal process typically, a p-Si second level conductive layer is removed by a etchant such as CF$_3$Cl plasma or a potassium hydroxide solution. The underlying insulating layer, if composed of SiO$_2$, is typically removed by CH$_4$ plasma or buffered hydrogen fluoride and the first conductive strip is removed by an etchant. Alternatively, the conductive layer 30, insulating layer 18a, and first conductive strip 16a may be removed simultaneously.

Substrate etching may occur if the conductive layer 30 and first conductive strip 16a are removable by the same etchant and the insulating layer 18a and barrier layer 14 are removable by the same etchant. Unlike prior art, even if substrate etching occurs the aligned removal process prevents a short to the substrate since the second strip 22a will not extend to the substrate 12 but instead the edges are aligned with the first strip 16a. If substrate etching is considered undesirable it may be prevented by depositing the first strip 16a to a thickness greater, such as approximately twice as thick or greater, than the second strip 22a. For example, a 500 nm thick first conductive strip and a 100 nm thick second conductive strip may be used. Preferably, substrate etching may be prevented by forming the barrier layer 14 to a greater thickness than the insulating layers 18a–18d, such as approximately twice as thick or greater.

After the aligned removal process it may be desirable to reduce the size of the second strip 22a. Typically, standard photolithographic and etching techniques are used to permit the second strip 22a to be removed but leave in place the first strip 16a and, generally, the insulating layer 18a. In this step it is again not critical to adhere to the required alignment tolerances, as electrical contact will be maintained so long as a portion of the second conductive strip 22a partially overlaps the area defined by the aperture 20a.

Although the principles of the multilayer interconnect and method for forming same have been described in relation to the semiconductor device 10, it is to be understood that these principles are applicable to other semiconductor devices having two or more conductive strips separated by an insulating layer. One such device structure includes an EEPROM such as disclosed by Ipri et al. in U.S. Pat. No. 4,513,397, incorporated herein by reference.

We claim:

1. A multilayer interconnect comprising a first conductive strip, an insulating layer having an aperture formed therethrough overlying the first strip, and a second conductive strip overlying the insulating layer and aperture, said second conductive strip electrically connected to the first conductive strip through said aperture wherein the improvement comprises;
   at least one edge of the first strip is aligned with an overlying edge of the second strip.

2. The multilayer interconnect of claim 1 wherein at least one edge of the first strip, insulating layer, and second strip are aligned.

3. The multilayer interconnect of claim 1 wherein the first strip is greater in thickness than the second strip.

4. The multilayer interconnect of claim 3 wherein the thickness of the first strip is greater than about twice the thickness of the second strip.

5. The multilayer interconnect of claim 1 further comprising a substrate and a barrier layer overlying said substrate, and said first conductive strip overlies said barrier layer, wherein the barrier layer is greater in thickness than the insulating layer.

6. The multilayer interconnect of claim 5 wherein the barrier layer is greater than about twice the thickness of the insulating layer.

7. The multilayer interconnect of claim 1 wherein the first and second strips are polysilicon.

8. The multilayer interconnect of claim 1 wherein the edge of said first strip is aligned with said second strip of said aperture.

9. The multilayer interconnect of claim 1 further comprising a substrate and said first strip overlies said substrate wherein said edge of said first strip does not extend to an edge of said substrate.

* * * * *